(12) United States Patent
Bleil et al.

(10) Patent No.: US 9,567,968 B2
(45) Date of Patent: Feb. 14, 2017

(54) METHOD FOR DETECTING A GLOW PLUG REPLACEMENT

(71) Applicant: BorgWarner Ludwigsburg GmbH, Ludwigsburg (DE)

(72) Inventors: Andreas Bleil, Ludwigsburg (DE); Michael Eberhardt, Neckargemünd (DE); Ralf Müller, Tamm (DE); Clemens Rinkert, Bretten (DE); Dirk Wollin, Pforzheim (DE); Markus Pados, Linkenheim-Hochstetten (DE)

(73) Assignee: BorgWarner Ludwigsburg GmbH, Ludwigsburg (DE)

( * ) Notice: Subject to any disclaimer, the term of this patent is extended or adjusted under 35 U.S.C. 154(b) by 15 days.

(21) Appl. No.: 14/451,688

(22) Filed: Aug. 5, 2014

(65) Prior Publication Data

US 2015/0042344 A1 Feb. 12, 2015

(30) Foreign Application Priority Data

Aug. 9, 2013 (DE) ........................ 10 2013 108 628

(51) Int. Cl.

| F02P 19/02 | (2006.01) |
| F02P 11/00 | (2006.01) |
| F02P 17/00 | (2006.01) |
| G01R 27/02 | (2006.01) |
| G01R 31/00 | (2006.01) |
| G01M 15/04 | (2006.01) |

(52) U.S. Cl.
CPC ............... *F02P 11/00* (2013.01); *F02P 17/00* (2013.01); *F02P 19/02* (2013.01); *G01R 27/02* (2013.01); *G01R 31/005* (2013.01); *F02P 19/025* (2013.01); *G01M 15/042* (2013.01)

(58) Field of Classification Search
CPC ...... F23Q 7/001; F23Q 2007/002; F23Q 7/22; F02P 19/02; F02P 19/025; F02P 19/023; F02P 19/021; F02P 19/026; F02P 19/027; F02P 19/28; F02P 13/00; F02P 17/00; F02P 17/12; G01R 27/02; G01R 31/005; G01R 31/02

See application file for complete search history.

(56) References Cited

U.S. PATENT DOCUMENTS

| 7,431,004 | B2 * | 10/2008 | Kernwein | F02P 19/027 |
| | | | | 123/145 A |
| 7,886,587 | B2 | 2/2011 | Moritz et al. | |
| 8,423,197 | B2 * | 4/2013 | Sakurai | F02P 19/027 |
| | | | | 700/296 |
| 8,826,729 | B2 | 9/2014 | Moritz et al. | |
| 2008/0319631 | A1 * | 12/2008 | Kernwein | F02P 19/027 |
| | | | | 701/102 |
| 2009/0193882 | A1 * | 8/2009 | Moritz | F02P 17/00 |
| | | | | 73/114.62 |
| 2010/0161150 | A1 * | 6/2010 | Sakurai | F02P 19/027 |
| | | | | 700/296 |
| 2013/0228007 | A1 * | 9/2013 | Moritz | F02P 17/00 |
| | | | | 73/114.58 |

FOREIGN PATENT DOCUMENTS

| DE | 10 2008 007 398 A1 | 8/2009 |
| DE | 10 2010 040 682 A1 | 3/2012 |

* cited by examiner

*Primary Examiner* — Alesa Allgood

(74) *Attorney, Agent, or Firm* — Bose McKinney & Evans LLP

(57) ABSTRACT

Described is a method for detecting a glow plug replacement of an engine, wherein a first value of a temperature-dependent variable is measured at a first glow plug of the engine and, simultaneously, a second value of the temperature-dependent variable is measured at a second glow plug of the engine. The first value of the temperature-dependent variable is compared with a stored reference value of the first glow plug and a glow plug replacement is detected if the difference of the first value from the reference value exceeds a threshold value. According to this disclosure, it is provided that the reference value is a value which, in an earlier measurement, was measured at the first glow plug simultaneously with the measurement of a value at the second glow plug which corresponds to the second value within a predefined tolerance.

10 Claims, No Drawings

METHOD FOR DETECTING A GLOW PLUG REPLACEMENT

RELATED APPLICATIONS

This application claims priority to DE 10 2013 108 628.4, filed Aug. 9, 2013, which is hereby incorporated herein by reference in its entirety.

BACKGROUND

The present invention is based on a method for detecting a glow plug replacement.

DE 10 2010 040 682 A1 discloses a known method for detecting the replacement of glow plugs, in which at least one electrical parameter of a glow plug is determined and compared with a stored value during a driving cycle, said stored value having been measured under the same conditions in an earlier driving cycle. If the two values differ from each other by more than an allowed threshold value, it is concluded that a glow plug replacement had taken place. A similar method is known from DE 10 2008 007 398 A1.

The automatic detection of a glow plug replacement is essential because modern glow plug control units adjust the temperature of a glow plug using a set of plug-specific control parameters. If the plug-specific control parameters are used unchanged after a glow plug replacement, there is the risk that the glow plug is operated at temperatures that are too low, resulting in suboptimal combustion of the fuel, or at temperatures that are too high, resulting in damage to the glow plug.

If a glow plug replacement is detected, a reminder to enter new control parameters may be put out or the glow plug control unit may automatically determine new control parameters by heating up the glow plug under controlled conditions. Such a determination is relatively complicated. To achieve this, a glow plug is typically operated for about one minute with a defined heating output while the vehicle is parking. For this reason, it is not practicable to determine new control parameters or subject the control parameters to an extensive check whenever the vehicle is started.

DESCRIPTION

This disclosure teaches a method for a control unit reliably detecting whether a glow plug of the engine has been replaced.

As is the case in conventional methods, a glow plug replacement is detected by a comparison of a current measurement value of an electrical variable of the glow plug with a historical measurement value. The historical measurement value is then called a reference value. To ensure that the comparison of a current measurement value with an earlier measurement value is meaningful, it is essential that both measurements were taken under identical conditions, i.e., that the glow plugs had a temperature which was exactly the same as far as possible in both measurements. It is complicated to create conditions for a measurement that are exactly defined and can be repeated, because there is a great number of interferences that occur while the vehicle is in operation.

According to this disclosure, an increased reliability is reached with simple means by observing tuples obtained from values of an electrical variable, for example the resistance, that are simultaneously measured at the glow plugs of an engine. Such a tuple contains a number of measurement values that is equal to the number of glow plugs of the engine, i.e., usually four measurement values. If one measurement value of such a tuple corresponds to the measurement value of the respective glow plug of another tuple, it is to be expected that the tuples also agree with each other with respect to the other measurement values because the temperatures of all glow plugs of an engine are always the same within narrow limits.

The check of whether a glow plug replacement took place can, therefore, be made in any operating state desired. The initial temperature of the glow plug, variations in voltage of the on-board supply system, the motor load or other influences which make it difficult to adjust defined glow plug temperatures in a reproducible manner are, at the most, of subordinate importance. How a glow plug has reached its current temperature is of no essence for the method according to this disclosure. It is not even necessary to know the actual temperature of a glow plug. It is sufficient to know that a temperature-dependent electrical variable of one of the glow plugs currently has the same value as in another tuple. That is to say that, if the values of the temperature-dependent variable of one glow plug of the two tuples correspond to each other, the other values of the two tuples must also correspond to each other. That is to say that, if one of the glow plugs has the same temperature as in the former measurement, the other glow plugs of the engine must have the same temperature as in the former measurement as well. If not, at least one of the glow plugs of the engine was replaced.

Since the temperature of a glow plug can vary continuously, it is essential that the electrical variable is measured simultaneously at all glow plugs. In this context, the term "simultaneously" should be understood to mean that the measurements were taken within a space of time that is so short that a relevant change in the temperature of the glow plugs cannot occur within this space of time. For example, the measurements can be taken at all glow plugs of an engine within a period of a tenth of a second. Therein, the electrical variable can be measured simultaneously at all glow plugs or one after the other at the individual glow plugs. What is of importance here is just that the time elapsing from the beginning of the measurement at the first glow plug until the end of the measurement at the last glow plug is so short that no relevant changes in temperature occur.

Since measuring inaccuracies cannot be avoided, it is usually not reasonable to demand a perfect match, i.e., exactly identical values, when the values of the different tuples are compared. It is sufficient to have compared values that match each other within predefined tolerances, i.e., that are different from each other by no more than a predefined threshold value.

The method can be applied in any operating state of the glow plugs, i.e., even if the glow plugs are cold. Preferably, the method is applied to heated up glow plugs. The term "heated up" does not mean that the glow plugs must have already reached their operating temperature provided for starting an engine but just that the temperature of the glow plugs is higher than the ambient temperature. For example, the method can be applied while the glow plugs are being heated up to their operating temperature for starting the engine and have, therein, already completed a part of the increase in temperature required to this end, for example, after a third of the heating up time has elapsed.

In order to apply a method according to this disclosure, a set of tuples can be stored in a memory of a control unit. Each of these tuples contains a measured value of a temperature-dependent electrical variable for each glow plug of the engine. That means that, in a four-cylinder engine, each tuple has, for example, the form (R1, R2, R3, R4) wherein R1 specifies the measurement value of the glow plug of the first cylinder, R2 specifies the measurement value of the glow plug of the second cylinder, R3 specifies the measurement value of the glow plug of the third cylinder, and R4 specifies the measurement value of the glow plug of the fourth cylinder. These tuples can be determined and stored when the glow plugs are heated up for the first time after a glow plug replacement or when the control unit is installed.

The number of the tuples stored in the memory may be relatively low. In extreme cases, a single tuple is sufficient. As soon as a value is measured at one of the glow plugs that matches the value of that glow plug, the method can be applied. For example, a temperature-dependent electrical variable of a predefined glow plug, for example the second glow plug of the engine, can be continuously measured when the glow plugs are heated up for the first time after a glow plug replacement. As soon as the value of this electrical variable reaches a predefined threshold, the temperature-dependent electrical variable is also measured at the other glow plugs and the tuple thus obtained is stored. In subsequent heating up operations, it is monitored when the value of the temperature-dependent variable of the glow plug in question reaches this threshold and as soon as this is the case a current tuple is obtained by measuring the electrical variable of all glow plugs. These two tuples then match each other at least with respect to the value of the predefined glow plug because this value then corresponds to the threshold value. If the tuples do not match each other in any one of the other values, a glow plug replacement took place. Then a signal is created, for example by setting a flag, which indicates that a glow plug has been replaced.

If, in the method according to this disclosure, it is detected that a measured value does not correspond to the reference value, this means that a glow plug replacement had indeed taken place; however, it is not known which one of the plugs was replaced. It is possible that the glow plug that was replaced was the one whose current value is different from its reference value. But it is also possible that another glow plug was replaced and that the current value of this glow plug now agrees to the respective value of the stored tuple. Since these matching values were measured at different glow plugs, such agreement occurs under different operating conditions, with the result that the tuples are different from each other in all other values.

While exemplary embodiments have been disclosed hereinabove, the present invention is not limited to the disclosed embodiments. Instead, this application is intended to cover any variations, uses, or adaptations of this disclosure using its general principles. Further, this application is intended to cover such departures from the present disclosure as come within known or customary practice in the art to which this invention pertains and which fall within the limits of the appended claims.

What is claimed is:

1. A method for detecting a glow plug replacement, comprising: measuring a temperature-dependent variable of a first glow plug of an engine to obtain a first value together with measuring the temperature-dependent variable of a second glow plug of the engine to obtain a second value; comparing the first value to a first prior value which was measured at an earlier time at the first glow plug of the engine; comparing the second value to a second prior value which was measured at the earlier time at the second glow plug of the engine; and creating a signal indicating that a glow plug of the engine has been replaced if the difference between the first value and the first prior value exceeds a threshold amount and if the second value matches the second prior value within a predefined tolerance.

2. A method for detecting a glow plug replacement, comprising:
    at a time $t_1$, simultaneously measuring a temperature-dependent variable of a first glow plug and a second glow plug of an engine and storing the measured values as first and second reference values, respectively;
    at a later time $t_2$ when the temperature-dependent variable measured for the first glow plug again matches the first reference value within a predefined tolerance, measuring the temperature-dependent variable of the second glow plug; and
    detecting a glow plug replacement if the difference between the temperature-dependent variable of the second glow plug measured at time $t_2$ and the second reference value exceeds a threshold amount.

3. The method according to claim 2, wherein the temperature-dependent variable is electrical resistance.

4. The method according to claim 2, wherein the temperature-dependent variable is measured when the first and second glow plugs are in a heated up operating state.

5. The method according to claim 2, further comprising, if the difference between the temperature-dependent variable of the second glow plug measured at time $t_2$ and the second reference value does not exceed the threshold value, checking whether the second reference value was measured under the same operating conditions as the temperature-dependent variable of the second glow plug measured at time $t_2$, and, if not, detecting a glow plug replacement.

6. The method according to claim 2, wherein the second reference value is determined by continuously measuring the temperature-dependent variable of the first glow plug while the first glow plug is being heated up and, as soon as the temperature-dependent variable of the first glow plug reaches a predefined value, the temperature-dependent variable is measured at the second glow plug and is used as the second reference value.

7. The method according to claim 2, further comprising storing a set of tuples in a memory of a control unit, each tuple containing simultaneously measured values of the temperature-dependent variable of the first and second glow plugs, wherein the method comprises, at time $t_2$, selecting a tuple from the set which includes the first reference value.

8. The method according to claim 2, wherein the first and second references values are deleted from the memory when a glow plug replacement is detected and, thereafter, new first and second reference values are determined and stored in the memory.

9. The method according to claim 2, wherein the first and second reference values are deleted and redetermined when a glow plug replacement is detected.

10. A glow plug control unit having a memory in which a program is stored which, when executed, causes the glow plug control unit to apply a method according to claim 2.

* * * * *